(12) United States Patent
Ono et al.

(10) Patent No.: US 6,298,473 B1
(45) Date of Patent: Oct. 2, 2001

(54) APPARATUS AND METHOD FOR INHIBITING PATTERN DISTORTIONS TO CORRECT PATTERN DATA IN A SEMICONDUCTOR DEVICE

(75) Inventors: Yusaku Ono; Koichi Moriizumi, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/204,281

(22) Filed: Dec. 3, 1998

(30) Foreign Application Priority Data

Jun. 29, 1998 (JP) .................................................. 10-182793

(51) Int. Cl.⁷ .............................. G06F 7/60; G06F 17/10; G03F 9/00; G03C 5/00
(52) U.S. Cl. ..................................... 716/21; 430/5; 430/30
(58) Field of Search .......................................... 716/10, 21

(56) References Cited

U.S. PATENT DOCUMENTS

| | | | |
|---|---|---|---|
| 5,051,598 | * 9/1991 | Ashton et al. | 250/492.2 |
| 5,086,398 | * 2/1992 | Moriizumi | 364/490 |
| 5,591,550 | * 1/1997 | Choi et al. | 430/5 |
| 5,972,541 | * 10/1999 | Sugasawara et al. | 430/5 |
| 6,014,456 | * 1/2000 | Tsudaka | 382/144 |
| 6,088,520 | * 7/2000 | Taoka et al. | 395/500.22 |
| 6,137,901 | * 10/2000 | Harazaki | 382/144 |

FOREIGN PATENT DOCUMENTS

360049627 * 3/1985 (JP) .............................. G03F/19/00
11026360 * 1/1999 (JP) .............................. H01L/21/027

OTHER PUBLICATIONS

K. Harafuji et al., A Novel Hierarchical Approach for Proximity effect Correction Electron Beam Lithography, IEEE Transactions on Computer–Aided Design of Integrated Circuits and Systems, pp. 1508–1514, Oct. 1993.*

"An Automated Method to Check Sidelobe Overlap Projected by Adjacent Apertures in Attenuated Phase–shift Masks", by Kyoji Nakajo, et al., SPIE vo. 3096, No. 0277–786X, 1997, pp. 154–162.

"Simple Method of Correcting Optical Proximity Effect for 0.35um Logic LSI Circuits", by Eiichi Kawamura, et al., Japanese Journal of Applied Physics, vol. 34, 1995, pp. 6547–6551.

* cited by examiner

*Primary Examiner*—Matthew Smith
*Assistant Examiner*—A. M. Thompson
(74) *Attorney, Agent, or Firm*—McDermott, Will & Emery

(57) ABSTRACT

A correction target edge extracting part of a layout pattern data correction apparatus extracts a correction target edge from circuit layout patterns. A density calculation region setting part of the apparatus sets density calculation regions around the center of the correction target edge. An area density calculating part calculates an area density of design patterns within the density calculation regions. Given the area density thus calculated, a correction pattern size calculating part calculates the size of a correction pattern to be superposed on the correction target edge. In accordance with the calculated size, a correction pattern generating part generates the correction pattern. A graphic calculating part adds up the correction pattern and design layout patterns to generate corrected layout patterns.

17 Claims, 9 Drawing Sheets

PRIOR ART

APPARATUS AND METHOD FOR INHIBITING PATTERN DISTORTIONS TO CORRECT PATTERN DATA IN A SEMICONDUCTOR DEVICE

BACKGROUND OF THE INVENTION

1. Field of the Invention

The present invention generally related to a layout pattern data correction method, a method for manufacturing a semiconductor device and a program storage medium readable by a computer. More particularly, the invention relates to a layout pattern data correction apparatus, a method for manufacturing a semiconductor device and a program storage medium readable by a computer suitable for improving dimension accuracy of a semiconductor device by means of inhibiting pattern distortions stemming from such pattern forming processes as optical lithography and etching.

2. Description of the Background Art

The proceedings for manufacturing a semiconductor device generally includes pattern forming processes such as optical lithography and etching. Where circuit patterns are to be photoengraved by optical lithography, so-called optical proximity effect, i.e., a phenomenon in which optical interference causes errors to pattern shapes becomes more pronounced the closer the width or pitch of circuit patterns to the wavelength of light for optical exposure. Dimensional changes that can occur in the etching process become greater the higher the density differences among the patterns in question. That is, the changes become more distinct as the patterns grow finer and the circuit pattern spacing becomes narrower.

The problem of dimensional changes stemming from pattern miniaturization is difficult to be resolved solely by improvements in the wafer process. Instead, the problem is generally dealt with by correcting layout patterns. Layout patterns are corrected conventionally by one of two methods. One method involves simulating the pattern forming processes and using the results of the simulation as the basis for correcting the patterns. The other method is so-called rule-based pattern correction whereby the patterns are corrected according to predetermined rules.

The simulation-based layout pattern correction method promises highly accurate correction. As a disadvantage, the method requires a tremendous amount of processing time, which renders it less practical than the rule-based pattern correction method. On the other hand, the rule-based pattern correction method has no need for complex calculations and thus has the advantage of effecting high-speed processing. As a disadvantage, the latter method has difficulty in correcting layout patterns with high accuracy.

How rule-based pattern correction is carried out conventionally will now be described with reference to FIGS. 15 through 19.

FIG. 15 is a schematic view of design layout patterns of metal wiring in a semiconductor device. The design layout patterns of FIG. 15 include one thick-line pattern 10 and four thin-line patterns 12 through 18. The thin-line patterns 14 through 18 are located close to the thick-line pattern 10, and the thin-line pattern 12 is positioned slightly away from the thick-line pattern 10.

Where the design layout patterns of FIG. 15 are to be formed by semiconductor processes, pattern distortions attributable to optical lithography and etching are likely to occur particularly on the edges of the thin-line patterns 12 through 18. To implement the design layout patterns with accuracy requires suitably correcting the edges of the thin-line patterns 12 through 18.

FIG. 16 is a schematic view showing correction target edges 20 through 27 which are extracted as edges to be subjected to correction while mask drawing data for optical lithography are being prepared. As shown in FIG. 16, the correction target edges 20 through 27 corresponds to the edges of the thin-line patterns 12 through 18. In conventional rule-based pattern correction, the target edges 20 through 27 are corrected so as to offset pattern distortions when the mask is drafted.

FIG. 17 is a schematic view of a correction pattern 28 having a correction target edge 24 as a center axis. The correction pattern 28 is formed by expanding the correction target edge 24 vertically and horizontally by an amount L. In the conventional rule-based pattern correction setup, the correction pattern of FIG. 17 is created for each of all extracted correction target edges 20 through 27.

FIG. 18 is a schematic view of corrected layout patterns. In the process of preparing the mask drawing data, these corrected layout patterns are obtained by adding a correction pattern 20 to the design layout patterns, i.e., by OR'ing the design layout patterns and the correction pattern 20. In conventional rule-based pattern correction, an optical lithography-ready mask is prepared on the basis of the corrected layout patterns shown in FIG. 18.

As described, the conventional rule-based pattern correction method using relatively simple steps is capable of preparing a mask that takes into account the adverse effects of pattern distortions stemming from optical lithography and etching. When thus prepared, the mask is used to transcribe the corrected layout patterns onto a semiconductor wafer. After etching and other related processes, metal wiring patterns are formed on the semiconductor wafer with the effects of pattern distortions minimized.

The optical proximity effect in optical lithography and the loading effect in etching vary with pattern density. Where patterns are minuscule and circuits are highly integrated, changes of these effects are particularly pronounced. Thus if layout patterns are high in density due to intensive circuit miniaturization, uneven pattern distortions is likely to occcur depending on the pattern density.

FIG. 19 is a schematic plan view of metal wiring formed by conventional rule-based pattern correction techniques. As mentioned, the conventional rule-based pattern correction involves uniformly correcting all edges 20 through 27 that have been extracted as target edges to be corrected. It follows that if densely arranged metal wiring is formed by the techniques above, some of the correction target edges are bound to be corrected excessively. Consequently, the metal wiring partially develops distorted portions 30 through 34 as shown in FIG. 19. As described, the conventional rule-based pattern correction method is plagued by the difficulty in implementing highly precise correction of layout patterns as the patterns become finer and the circuits integrated in higher degrees than before.

SUMMARY OF THE INVENTION

It is therefore a first object of the present invention to overcome the above and other deficiencies and disadvantages of the prior art and to provide a layout pattern data correction apparatus for generating highly precise correction patterns where layout patterns are minuscule and circuits are highly integrated.

The above objects of the present invention is achieved by a layout pattern data correction apparatus. The apparatus includes: a correction target edge extracting part for extracting a correction target edge to be corrected from circuit layout patterns; a density calculation region setting part for setting density calculation regions around a given point on said correction target edge; an area density calculating part for calculating an area density of layout patterns within said density calculation regions; a correction pattern size calculating part for calculating a size of a correction pattern to be generated on said correction target edge on the basis of the calculated area density; and a correction pattern generating part for generating the correction pattern in accordance with the size calculated by said correction pattern size calculating part.

It is a second object of the invention to provide a method for manufacturing a semiconductor device with high dimensional precise by generating highly precise correction patterns where layout patterns are minuscule and circuits are highly integrated.

The above objects of the present invention is achieved by a method for manufacturing a semiconductor device. The method includes the steps for: extracting a correction target edge to be corrected from circuit layout patterns; setting density calculation regions around a given point on said correction target edge; calculating an area density of layout patterns within said density calculation regions; calculating a size of a correction pattern to be generated on said correction target edge on the basis of the calculated area density; and generating the correction pattern in accordance with the size calculated by said correction pattern size calculating step.

It is a third object of the invention to provide a program storage medium readable by a computer capable of storing programs for causing a computer to generate highly precise correction patterns where layout patterns are minuscule and circuits are highly integrated.

The above objects of the present invention is achieved by a program storage medium readable by a computer storing semiconductor device manufacturing programs. The programs cause a computer to: extract a correction target edge to be corrected from circuit layout patterns; set density calculation regions around a given point on said correction target edge; calculate an area density of layout patterns within said density calculation regions; calculate a size of a correction pattern to be generated on said correction target edge on the basis of the calculated area density; and generate the correction pattern in accordance with the calculated size.

Other objects and further features of the present invention will be apparent from the following detailed description when read in conjunction with the accompanying drawings.

DESCRIPTION OF THE PREFERRED EMBODIMENTS

Figure 1:
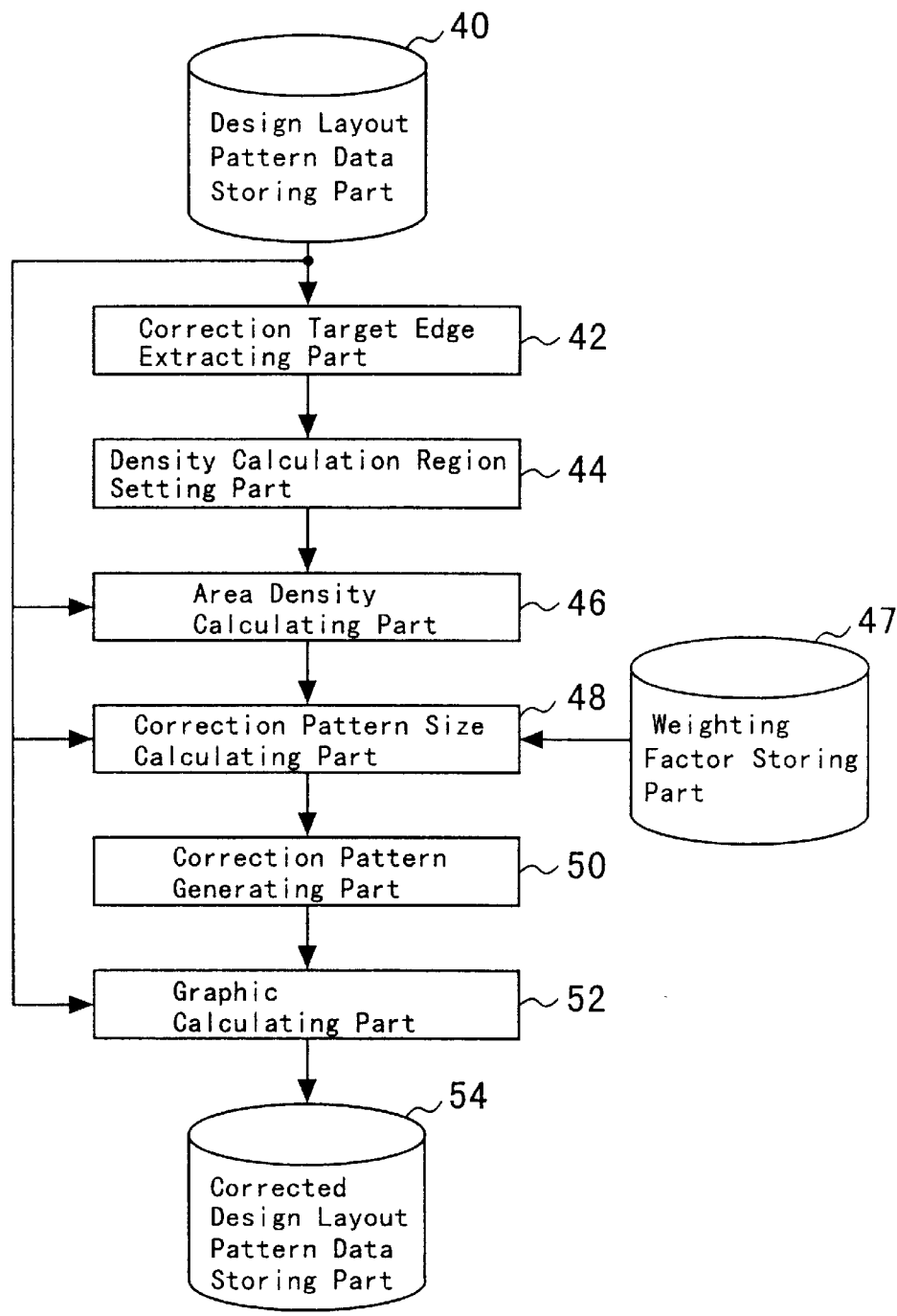
FIG. 1 is a block diagram of a layout pattern data correction apparatus according to a first embodiment of the present invention.

In the following, principles and embodiments of the present invention will be described with reference to the accompanying drawings. Throughout the drawings, the same reference numerals designate the same or corresponding elements, and repetition of their explanations are omitted.

First Embodiment

FIG. 1 is a block diagram of a layout pattern data correction apparatus practiced as a first embodiment of the present invention. The constitution shown in FIG. 1 may be implemented by a known computer system.

As illustrated in FIG. 1, the correction apparatus constituting the first embodiment includes a design layout pattern data storing part 40 (called the uncorrected data storing part 40 hereunder). The uncorrected data storing part 40 stores data about layout patterns of circuits to be implemented by the proceedings of semiconductor device manufacturing, i.e., data about sizes, shapes and layouts of metal wiring to be formed.

The design layout pattern data held in the uncorrected data storing part 40 are fed to a correction target edge extracting part 42. Where metal wiring of a semiconductor device is to be formed by pattern forming processes such as optical lithography and etching, the edges in the longitudinal direction (called the longitudinal edges hereunder) of thin-line patterns tend to be etched by a significantly greater amount than their edges in the crosswise direction (called the crosswise edges hereunder). Thus in order to form the metal wiring with high precision, it is preferable to furnish the longitudinal edges of the thin-line patterns with correction patterns for offsetting over-etching. On the basis of the layout pattern data, the correction target edge extracting part 42 extracts from all edges of the metal wiring those edges judged, as described, to be appropriate for being furnished with correction patterns. The extracted edges are stored as correction target edges.

Information about the correction target edges extracted by the correction target edge extracting part 42 is supplied to a density calculation region setting part 44. The density calculation region setting part 44 establishes density calculation regions for each of all correction target edges that have been extracted. With the first embodiment, as will be described later, the density calculation region setting part 44 sets a plurality of density calculation regions of different sizes for each correction target edge, the center of each correction target edge serving as a central point for each of the density calculation regions.

Information about density calculation regions calculated by the density calculation region setting part 44 is supplied to an area density calculating part 46. In addition to the information about the density calculation regions, the area density calculating part 46 receives data about design layout patterns. Using the two kinds of information, the area density calculating part 46 calculates the ratio of design patterns that exist within each of the individual density calculation regions, i.e., the area density of design patterns within the density calculation regions.

Information about area density calculated by the area density calculating part 46 is supplied to a correction pattern size calculating part 48. Along with the information about area densities, the correction pattern size calculating part 48 is fed with the data about the design layout patterns. Furthermore, the correction pattern size calculating part 48 receives information about weighting factors from a weighting factor storing part 49.

As described, the first embodiment has a plurality of density calculation regions of different sizes set for each correction target edge, and calculates the area density of each density calculation region. Weighting factors stored in the weighting factor storing part 49 are determined in advance for each of the density calculation regions of different sizes. A weighting factor is established so as to express the magnitude of effects on pattern distortions according to the area density of a given density calculation region. The weighting factors will be described later in more detail.

The correction pattern size calculating part 48 calculates the longitudinal and crosswise dimensions of a correction pattern to be applied to a given correction target edge. The calculations are performed on the basis of the three kinds of information mentioned above, i.e., (1) information included in the design layout pattern data, regarding the lengths of individual correction target edges (design pattern widths); (2) information about the area densities of each of the correction target edges; and (3) weighting factors about individual area densities of each of the correction target edges.

The correction pattern sizes calculated by the correction pattern size calculating part 48 are supplied to a correction pattern generating part 50. The correction pattern generating part 50 calculates correction patterns depending on the supplied size. Information about the correction patterns generated by the correction pattern generating part 50 is supplied to a graphic calculating part 52.

In addition to the information about correction patterns, the graphic calculating part 52 receives information about design layout patterns. The graphic calculating part 52 adds up (i.e., OR's) a correction pattern and a design layout pattern to generate a layout pattern wherein the two patterns overlap. A layout pattern generated by the graphic calculating part 52 is called a corrected layout pattern hereunder.

Information about corrected layout patterns generated by the graphic calculating part 52 is stored in a corrected design layout pattern data storing part 54 (called the corrected data storing part 54 hereunder). A mask is prepared on the basis of the corrected layout pattern data held in the corrected data storing part 54. The mask is then used to perform optical lithography followed by etching and other processes, whereby desired metal wiring is formed.

Figure 15:
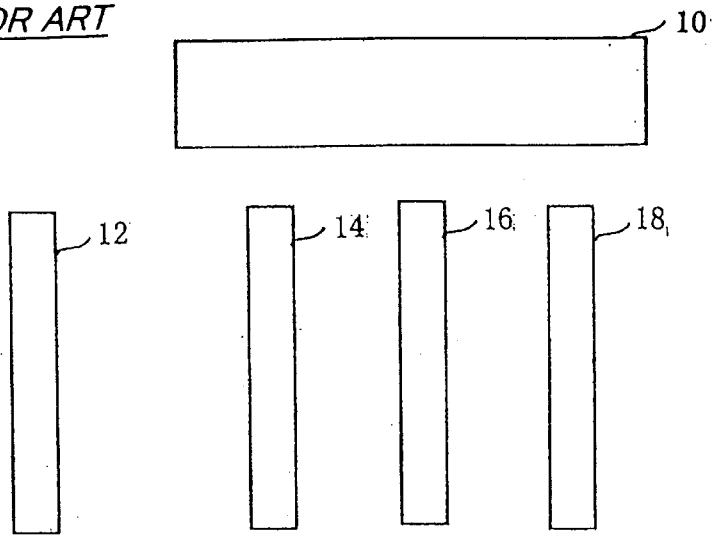
FIG. 15 is a schematic view of design layout patterns targeted for correction by an existing correction apparatus.
Figure 16:
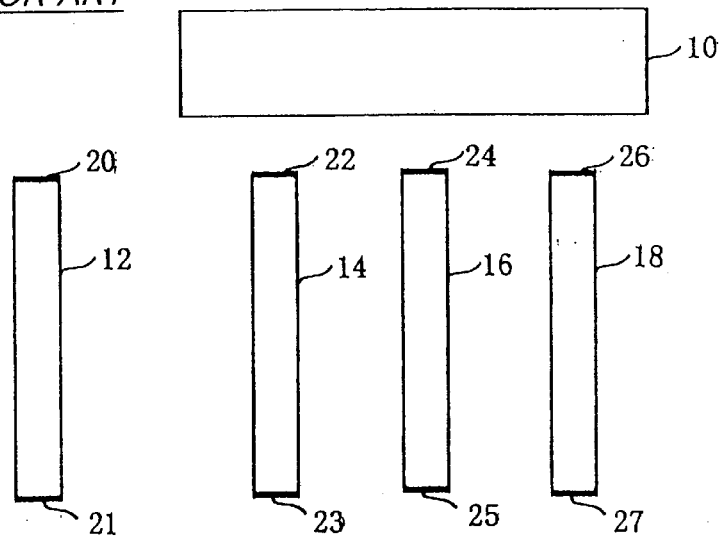
FIG. 16 is a schematic view showing correction target edges extracted by the existing correction apparatus.
Figure 17:
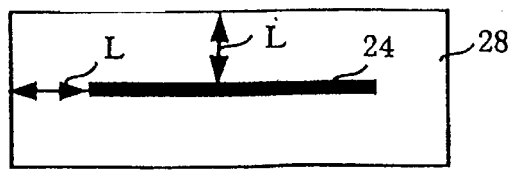
FIG. 17 is a schematic view of a correction pattern generated by the existing correction apparatus.
Figure 18:
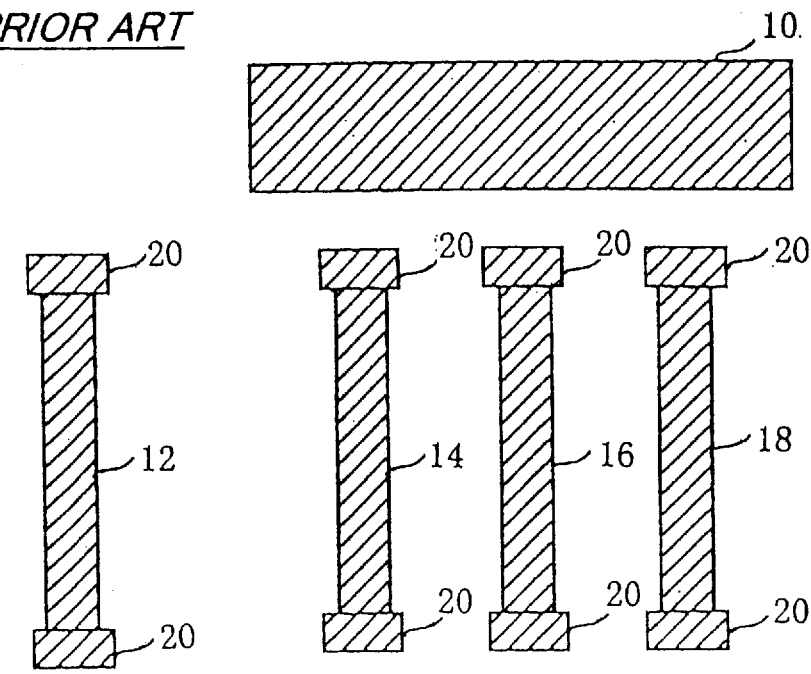
FIG. 18 is a schematic view of corrected layout patterns generated by the existing correction apparatus.
Figure 19:
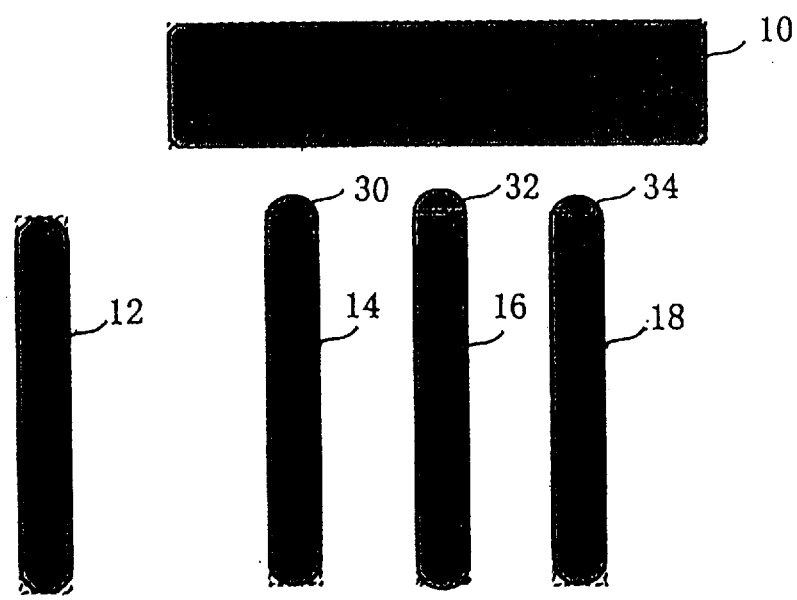
FIG. 19 is a schematic view of metal wiring formed by use of mask drawing data shown in FIG. 18.

Described below with reference to FIGS. 15 and 16 as well as FIGS. 2 through 8 is how the layout pattern data correction apparatus practiced as the first embodiment operates when the design layout patterns shown in FIG. 15 are established.

Figure 2:
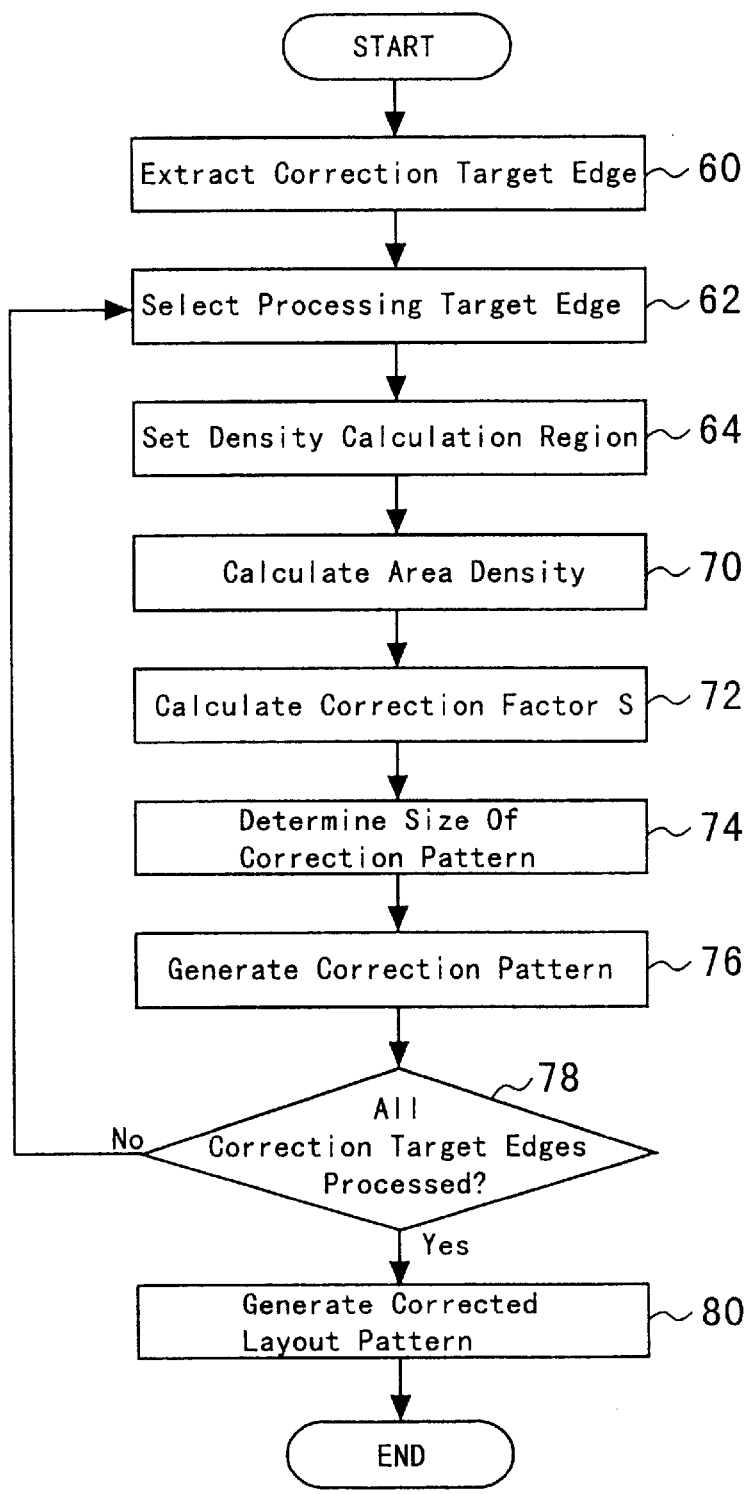
FIG. 2 is a flowchart of steps carried out by the correction apparatus according to the first embodiment of the present invention.

FIG. 2 is a flowchart of steps carried out by the first embodiment to acquire corrected layout pattern data. The series of the processing in FIG. 2 starts with step 60.

In step 60, correction target edges are extracted on the basis of the design layout pattern data held in the uncorrected data storing part 40. If the design layout patterns are those of FIG. 15, performing step 60 causes the edges 20 through 27 shown in FIG. 16 to be extracted as correction target edges. With the first embodiment, the correction target edge extracting part 42 shown in FIG. 1 is implemented when step 60 is carried out.

In step 62, an edge to be processed during the current processing cycle (called a processing target edge hereunder) is selected from all extracted correction target edges. Every time step 62 is carried out, a different correction target edge is selected as the processing target edge.

In step 64, a density calculation region is set for the processing target edge. With the first embodiment, the density calculation region setting part 44 shown in FIG. 1 is implemented when step 64 has been performed on all correction target edges.

Figure 3:
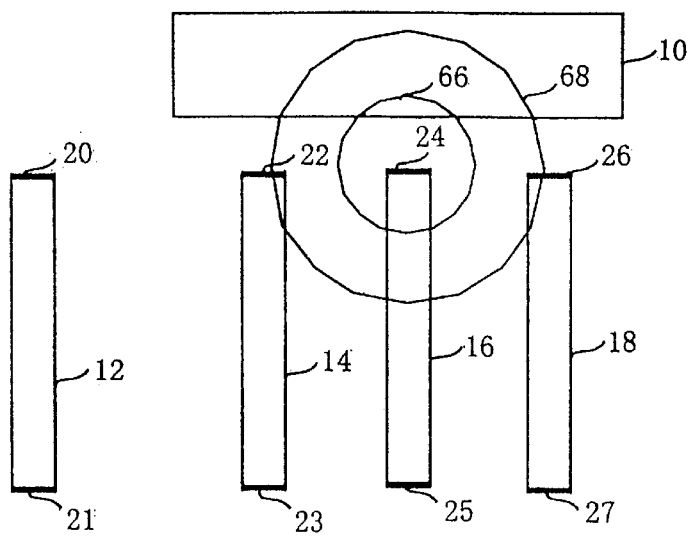
FIG. 3 is a schematic view of density calculation regions established by the correction apparatus according to the first embodiment of the present invention.

FIG. 3 is a schematic view of two density calculation regions 66 and 68 established by execution of step 64 when the correction target edge 24 is the processing target edge. As depicted in FIG. 3, the first embodiment establishes two density calculation regions 66 and 68 of different sizes for a single processing target edge.

The correction apparatus constituting the first embodiment grasps in coordinate data the sizes and shapes of the thick-line pattern 10 and thin-line patterns 12 through 18 as well as the lengths and positions of the correction target edges 20 through 27. Likewise, the correction apparatus grasps in coordinate data the positions and shapes of the density calculation regions 66 and 68. With the first embodiment, each of the density calculation regions 66 and 68 forms a regular polygon. Each of these regular polygons approximates a circle possessing its own radius and having its central point located at the center of the processing target edge in question.

The number of vertexes making up each regular polygon is determined so that the density calculation regions 66 and 68 may each be regarded approximately as a circle, in other wards, the regions 66 and 68 may each have a uniformly expanded area around the center of the processing target edge, and that calculations to set up the regions 66 and 68 will not be unduly demanding. The number of density calculation regions per correction target edge is not limited to two. Either one density calculation region or more than two such regions may be used instead.

When the density calculation regions 66 and 68 are established for the processing target edge in the manner described, step 70 is reached and carried out as shown in FIG. 2. In step 70, the ratio of the design patterns that exist within each of all established density calculation regions 66 and 68 is calculated, i.e., the area density of the design patterns is computed. With the first embodiment, the area density calculating part 46 shown in FIG. 1 is implemented when step 70 has been performed on all correction target edges.

Figures 4A, 4B:
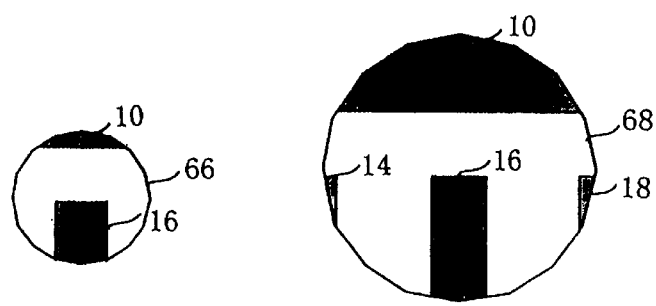
FIG. 4A shows design patterns existing within one of the density calculation regions shown in FIG. 3.
FIG. 4B shows design patterns existing within the other density calculation regions shown in FIG. 3.

FIGS. 4A and 4B are schematic views of design patterns extracted from inside each of the density calculation regions 66 and 68. As illustrated in FIG. 4A, within the density calculation region 66 are a tip of the thin-line pattern 16 and a portion of the thick-line pattern 10. Inside the density calculation region 68, as shown in FIG. 4B, are a tip of the thin-line pattern 16, corners of the thin-line patterns 14 and 18, and a portion of the thick-line pattern 10.

The correction apparatus constituting the first embodiment may use the data about design layout patterns and the data about the density calculation regions 66 and 68 to obtain areas A1 and A2 of the density calculation regions 66 and 68 respectively, and area sums P1 and P2 of the design patterns included within the two regions. In step 70, area density characteristic values D1 and D2 are calculated by inserting the area values acquired above into the following expressions:

$$D1 = P1/A1$$

$$D2 = P2/A2$$

When the area density characteristic values D1 and D2 have been calculated for all density calculation regions 66 and 68 in the manner described, step 72 is reached and executed as shown in FIG. 2. In step 72, a correction factor S is calculated with respect to the processing target edge in question. The correction factor S is used to correct pattern distortions stemming from the density differences among design patterns. With the first embodiment, the correction factor S is calculated using the following expression based on the area density characteristic values D1 and D2 as well as on weighting factors W1 and W2 (W1>W2):

$$S = D1*W1 + D2*W2$$

The magnitude of pattern distortions near the correction target edges 20 through 27 becomes greater the closer other patterns are to the target edges 20 through 27, i.e., the denser the patterns are laid out near these target edges. For that reason, the area density in the density calculation region 66 having the smaller radius affects more appreciably the magnitude of pattern distortions on the correction target edges 20 through 27 than the area density inside the density calculation region 68 of the larger radius.

The weighting factors W1 and W2 used in step 72 above are established beforehand for the density calculation regions 66 and 68 respectively in order to reflect the difference of the distortion-related influence in the correction factor S. This means that carrying out step 72 allows the correction factor S accurately to reflect the magnitude of the influence exerted by the nearby patterns on each correction target edge.

In step 74, the size of the correction pattern is determined on the basis of the correction factor S. With the first embodiment, each correction pattern is shaped to be rectangular. The correction apparatus constituting the first embodiment separately stores rules by which the longitudinal and crosswise dimensions of rectangular correction patterns are determined respectively. Such rules are established beforehand by experiments or by simulation.

In step 74, the longitudinal and crosswise dimensions of each correction pattern are determined by having both the width of the processing target edge and the correction factor S used as parameters, using the rules above. With the first embodiment, the correction pattern is set to be smaller in size the higher the pattern density, i.e., the greater the correction factor S. For the first embodiment, the correction pattern size calculating part 48 shown in FIG. 1 is implemented when steps 72 and 74 have been carried out on all correction target edges.

In step 76, the longitudinal and crosswise dimensions determined in step 74 are used to generate a correction pattern. With the first embodiment, the correction pattern generating part 50 shown in FIG. 1 is implemented when step 76 is carried out.

Figure 5:
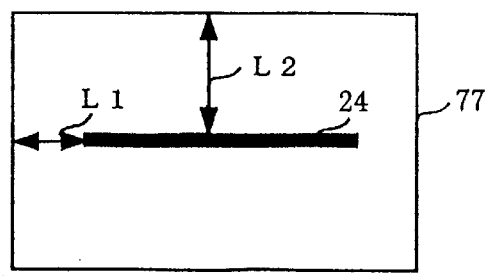
FIG. 5 is a schematic view of a correction pattern generated by the first embodiment of the present invention.

FIG. 5 is a schematic view of a correction pattern 77 generated by the process of step 76 above. As depicted in FIG. 5, the coordinates of the correction pattern 77 are determined so that the central axis of the pattern 77 will coincide with the correction target edge 24. With the first embodiment, the correction pattern 77 has a size obtained by expanding the correction target edge 24 longitudinally by 2*L1 and crosswise by 2*L2.

As described, the correction apparatus constituting the first embodiment uses predetermined rules and such parameters as the correction factor S to generate easily correction patterns suitable for minimizing pattern distortions stemming from the density differences between patterns. Acting as it does, the first embodiment can make corrections with ease and precision as needed for the formation of metal wiring in a setup where patterns are minuscule and circuits are highly integrated.

As described, the correction apparatus constituting the first embodiment separately establishes longitudinal and crosswise dimensions of correction patterns. Furthermore, the first embodiment determines the coordinates of each correction pattern so that the center line of the pattern will coincide with the correction target edge thereof. In order to form metal wiring with high precision around correction target edges, it is desirable to have an appreciable degree of freedom in designing the aspect ratio of each correction pattern. It is also desirable that the center line of each correction pattern coincide with its correction target edge. The two requirements are met by the above-described constitution. In this manner, the correction apparatus making up the first embodiment is capable of forming metal wiring with high accuracy around the individual correction target edges 20 through 27.

In step 78, a check is made to see if the above series of steps has been carried out on all correction target edges. If all correction target edges have not yet been dealt with, step 62 is reached again for another processing. If all correction target edges are found to have been processed, step 80 is reached.

In step 80, graphic calculations are performed on each uncorrected layout pattern and on the correction pattern generated in step 76. Specifically, the two patterns are added up to generate a corrected layout pattern. With the correction patterns (including the pattern 77) and the uncorrected layout patterns together undergoing automatic graphic calculations, each uncorrected layout pattern and its applicable correction pattern are aligned precisely and easily. The correction apparatus constituting the first embodiment thus prevents invariably any deterioration of precision in generating corrected layout patterns.

With step 80 completed, corrected layout pattern data are stored into the corrected data storing part 54 (see FIG. 1), and the processing comes to an end. With the first embodiment, the graphic calculating part 52 shown in FIG. 1 is implemented when step 80 is carried out.

Figure 6:
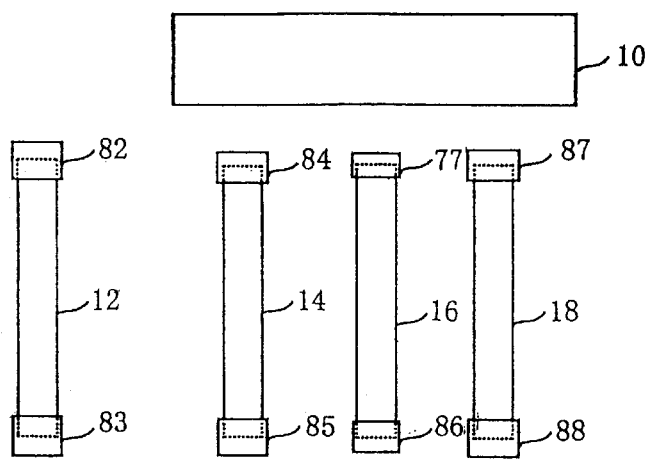
FIG. 6 is a schematic view of a corrected layout pattern generated by the first embodiment of the present invention.

FIG. 6 is a schematic view of corrected layout patterns generated by the series of steps shown in FIG. 2. In FIG. 6, the amount of oversize relative to a design pattern is set to be the smallest for the correction pattern 77 having the highest area density and the greatest for the correction pattern 82 having the lowest area density. In this manner, the correction apparatus constituting the first embodiment is capable of correcting individual correction target edges with their pattern densities taken into account.

Figure 7:
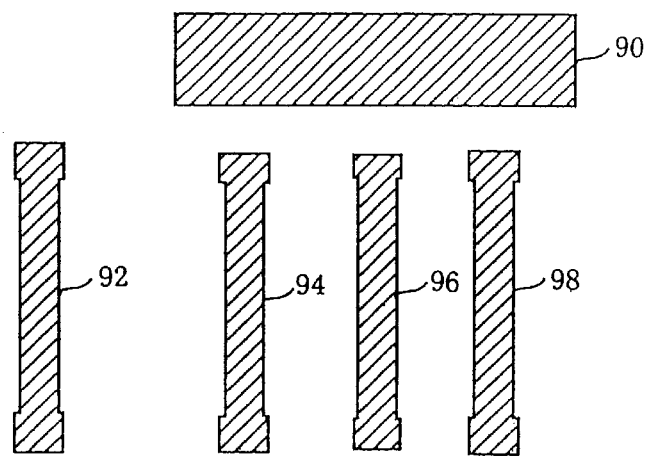
FIG. 7 is a schematic view of mask drawing data generated by use of data representing the corrected layout patterns shown in FIG. 6.

FIG. 7 is a schematic view of mask drawing data generated by use of data representing the corrected layout patterns shown in FIG. 6. The mask drawing data in FIG. 7 have patterns 90 through 98 corresponding to the individual patterns included in the corrected layout patterns. A mask prepared on the basis of the mask drawing data in FIG. 7 is used to perform optical lithography followed by etching and other related processes. This allows desired metal wiring to be formed on the semiconductor wafer.

Figure 8:
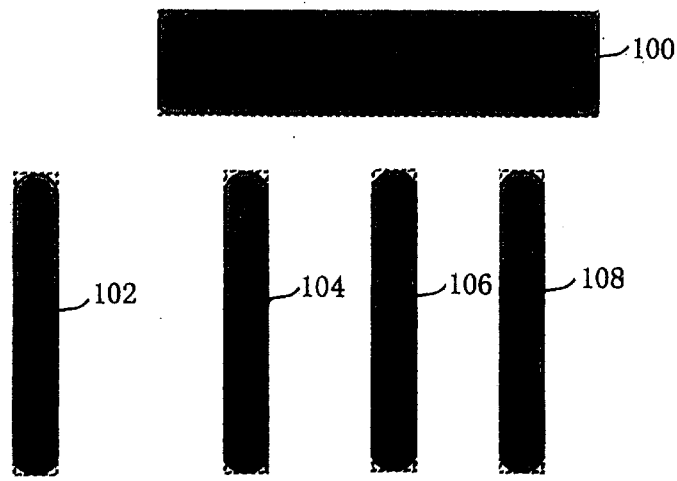
FIG. 8 is a schematic view of metal wiring formed by use of mask drawing data shown in FIG. 7.

Solid lines in FIG. 8 plot the shapes of metal wiring formed by the semiconductor processes using the mask prepared on the basis of the mask drawing data in FIG. 7. The shapes indicated by broken lines in FIG. 8 denote design layout patterns. As illustrated in FIG. 8, the mask prepared from the mask drawing data in FIG. 7 may be used to form metal wires 100 through 108 that correspond accurately to the thick-line pattern 10 and thin-line patterns 12 through 18 furnished by the design layout patterns. That is, the correction apparatus constituting the first embodiment is capable of correcting individual correction target edges by just the right amount without being affected by the design pattern density. Even where design patterns are minuscule and circuits are highly integrated, the first embodiment carries out highly precise correction of all circuit patterns.

Second Embodiment

A second embodiment of the invention will now be described with reference to FIGS. 9 through 11. A layout pattern data correction apparatus practiced as the second embodiment has the same system configuration as the first embodiment. The correction apparatus of the second embodiment is implemented when processes to be described below are carried out in the individual steps in FIG. 2.

Figure 9:
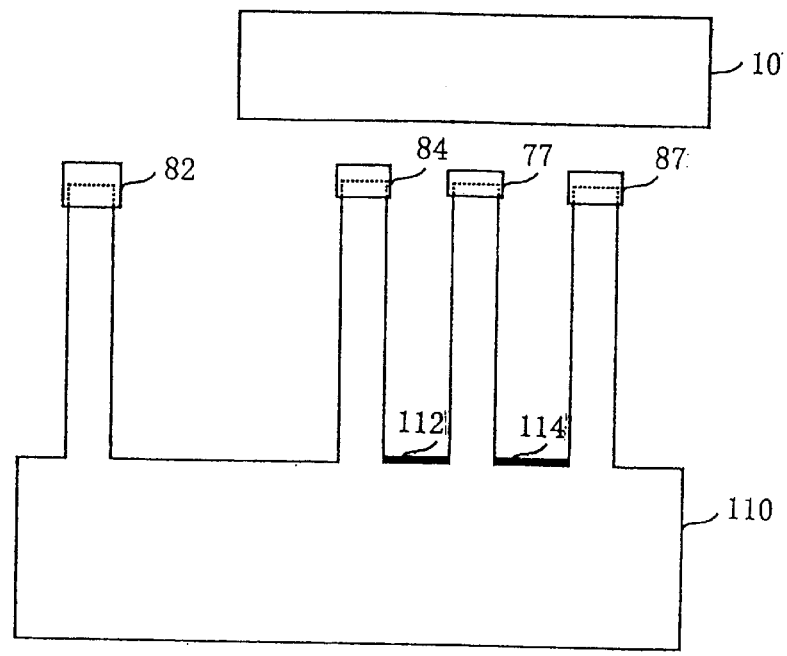
FIG. 9 is a schematic view of layout patterns targeted for correction in the second embodiment.

FIG. 9 is a schematic view of layout patterns targeted for correction in the second embodiment. The layout patterns in FIG. 9 include a pattern 110 that has a plurality of thin-line patterns. To the longitudinal edges of the multiple thin-line patterns are added correction patterns 77, 82, 84 and 87 obtained in the same manner as with the first embodiment. The pattern 110 has concave portions between thin-line patterns.

Concave portions of semiconductor circuits are difficult to etch. To form precise metal wiring of the circuits effectively under such difficulties requires taking corrective measures compensating for the insufficiently etched concave portions. For the second embodiment, in step 60 of FIG. 2, the bottoms of the narrow concaves are extracted as correction target edges 112 and 114 in addition to the longitudinal edges of the thin-line patterns to satisfy the above requirement.

In step 64 of FIG. 2 with the second embodiment, the correction target edges 112 and 114 are each set with density calculation regions as is the case with the first embodiment. Below is a description of an example where "k" density calculation regions are established for each of the correction target edges 112 and 114.

The second embodiment is capable of acquiring not only the area An (n=1 to k) of each density calculation region but also the sum Pn (n=1 to k) of the areas of design patterns that exist inside the individual density calculation regions. In step 70 of FIG. 2 with the second embodiment, the values An and Pn are inserted into the following expression to compute an area density characteristic value Dk for each density calculation region:

$$Dn=1-(Pn/An)$$

The expression above shows that the higher the area density of the design patterns, the smaller the area density characteristic value Dn. In step 72 of FIG. 2, the area density characteristic value Dn obtained as described and a predetermined weighting factor Wn are used to calculate the correction factor S in the same manner as with the first embodiment (S=D1*W1+. . . +Dk*Wk).

In step 74 of FIG. 2, the size of a correction pattern is determined in the same manner as with the first embodiment. With step 74 carried out for the second embodiment, the higher the area density of a design pattern (hence the smaller the correction factor S), the greater the size determined for the correction pattern.

In step 80 of FIG. 2 with the second embodiment, graphic calculations are performed so as to remove (i.e., to subtract) the correction patterns from the design layout patterns. With the second embodiment, carrying out step 80 forms corrected layout patterns.

Figure 10:
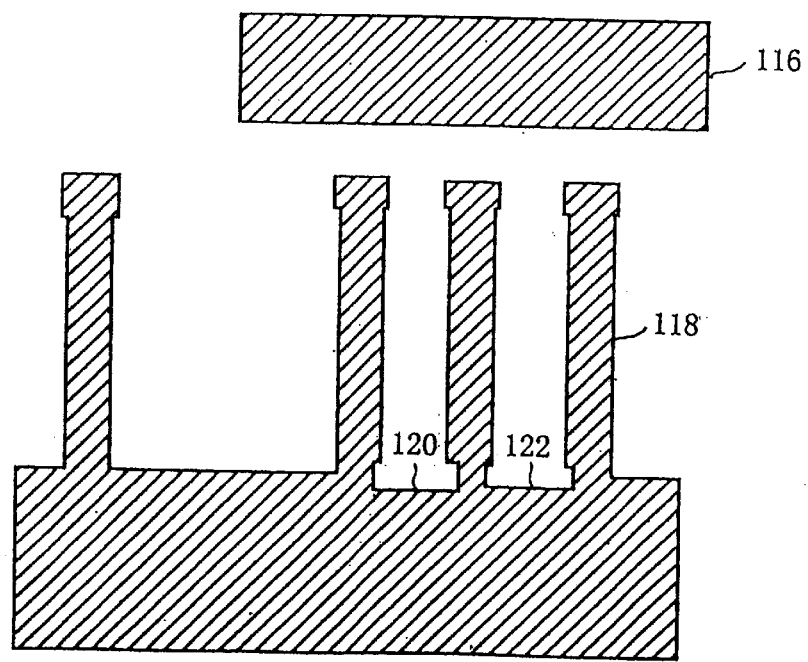
FIG. 10 is a schematic view of mask drawing data prepared by use of data representing the corrected layout patterns shown in FIG. 9.

FIG. 10 is a schematic view of mask drawing data prepared by use of data representing the corrected layout patterns generated by the second embodiment. The mask drawing data shown in FIG. 10 have patterns 116 and 118 corresponding to the corrected layout patterns. The pattern 118 has notches 120 and 122 located corresponding to the correction target edges 112 and 114.

Figure 11:
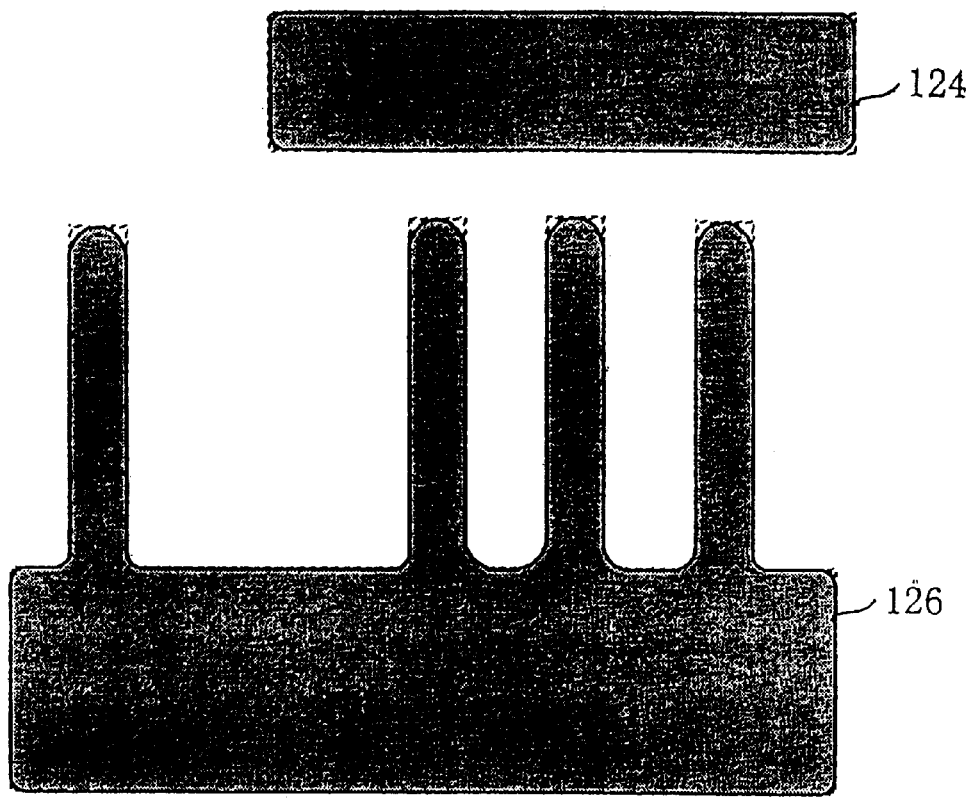
FIG. 11 is a schematic view of metal wiring formed by use of mask drawing data shown in FIG. 10.

Solid lines in FIG. 11 plot the shapes of metal wiring formed by the semiconductor processes using the mask prepared on the basis of the mask drawing data shown in FIG. 10. The shapes indicated by broken lines in FIG. 11 denote design layout patterns. As illustrated in FIG. 11, the mask prepared from the mask drawing data in FIG. 10 may be used to form metal wires 124 and 126 that correspond accurately to the thick-line pattern 10 and the pattern 110 furnished by the design layout patterns. That is, the correction apparatus constituting the second embodiment is capable of accurately correcting distortions of all circuit patterns even if design layout patterns contain concave portions.

Third Embodiment

A third embodiment of the present invention will now be described with reference to FIGS. 12 through 14. A layout pattern data correction apparatus practiced as the third embodiment has the same system configuration as the first embodiment. The correction apparatus of the third embodiment is implemented when processes to be described below are carried out in the individual steps of FIG. 2.

Figure 12:
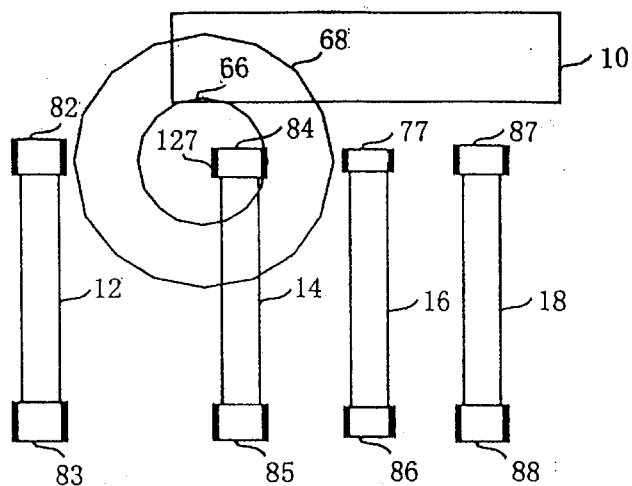
FIG. 12 is a schematic view of layout patterns targeted for correction in the third embodiment and density calculation regions provide of the layout patterns.

FIG. 12 is a schematic view of layout patterns targeted for correction in the third embodiment. As shown in FIG. 12, the layout patterns to be corrected by the third embodiment coincide with the corrected layout patterns (FIG. 6) obtained by the first embodiment. That is, the correction apparatus constituting the third embodiment is characterized by its ability to further correct the corrected layout patterns acquired in the same manner as with the first embodiment.

In step 60 of FIG. 2 with the third embodiment, the longitudinal edges of the correction patterns 77 and 82 through 88 are extracted as correction target edges which are called second correction target edges hereunder. In step 62, a processing target edge is selected from the second correction target edges. In step 64, density calculation regions 66 and 68 are set for the second correction target edge selected as the processing target edge.

FIG. 12 is a schematic view showing a state where the density calculation regions 66 and 68 are set for the second correction target edge 127 which is included in the correction pattern 84 and which has been selected as the processing target edge. From this point on, the third embodiment carries out the same processes as the first embodiment to generate correction patterns for all second correction target edges. The correction patterns thus generated are superposed on the layout patterns in FIG. 12 to create corrected layout patterns.

Figure 13:
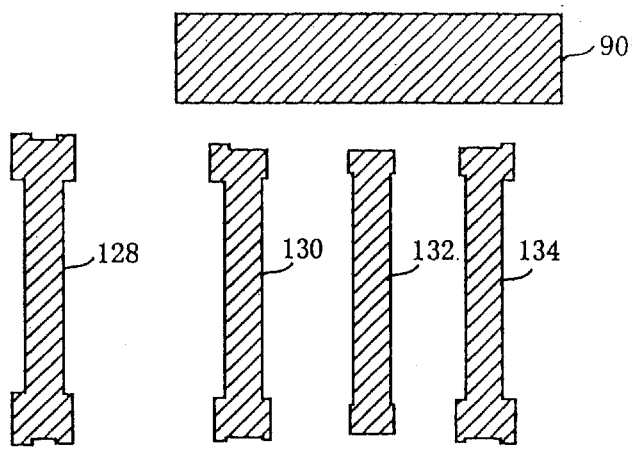
FIG. 13 is a schematic view of mask drawing data prepared by use of data representing the corrected layout patterns shown in FIG. 12.

FIG. 13 is a schematic view of mask drawing data prepared corresponding to the corrected layout patterns generated in the steps described above. The mask drawing data in FIG. 13 include patterns 128 through 134 wherein correction patterns are located on the longitudinal edges and wherein more correction patterns are located on longitudinal edges of the correction patterns.

Figure 14:
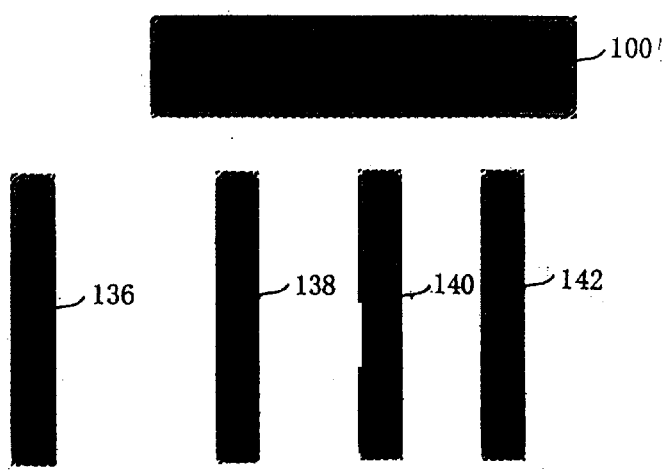
FIG. 14 is a schematic view of metal wiring formed by use of mask drawing data shown in FIG. 13.

Solid lines in FIG. 14 plot the shapes of metal wiring formed by the semiconductor processes using the mask prepared on the basis of the mask drawing data shown in FIG. 13. The shapes indicated by broken lines in FIG. 14 denote design layout patterns. As illustrated in FIG. 14, the mask prepared from the mask drawing data in FIG. 13 may allow to inhibit pattern distortions sufficiently and be used to form metal wires that coincide accurately with the design layout patterns. Thus even if design patterns are minuscule and circuits are highly integrated, the third embodiment is capable of implementing desired metal patterns precisely regardless of the difference among pattern densities.

To sum up, the invention described above offers the following major advantages:

According to the first aspect of the present invention, each of correction target edges included in layout patterns may be provided with a correction pattern whose size is determined with the pattern density taken into consideration. Thus where design patterns are minuscule and circuits are highly integrated, the inventive correction apparatus or method still generates with accuracy correction patterns that effectively inhibit pattern distortions stemming from the difference among pattern densities.

According to the second aspect of the present invention, graphic calculations may be performed on uncorrected layout patterns and on correction patterns. This makes it possible to generate corrected layout pattern data easily and precisely.

According to the third aspect of the present invention, a plurality of density calculation regions may be established so as to calculate reasonably the density of patterns of each part where correction target edge is located. By precisely calculating the density of each correction target edge, the inventive correction apparatus or method enhances the accuracy of correction patterns.

According to the fourth aspect of the present invention, each correction target edge may be provided with a rectangular correction pattern which has its correction target edge regarded as a center line and which has a desired aspect ratio. To form patterns accurately around correction target edges involves meeting two requirements: that the center line of each correction pattern coincide with a correction target edge; and that an appreciable degree of freedom in design be left regarding the aspect ratio of correction patterns. In meeting the two requirements, the inventive correction apparatus or method is capable of forming patterns with high precision around each correction target edge.

According to the fifth aspect of the present invention, appropriate edges of correction patterns may be further extracted as correction target edges. This means that a correction pattern may be superposed on the edge of another correction pattern. This allows the inventive correction apparatus or method to further boost the accuracy of correction around correction target edges.

According to the sixth aspect of the present invention, precisely generated correction patterns may be used to design layout patterns of semiconductor devices. This makes it possible to manufacture semiconductor devices of minuscule circuit patterns with a high yield percentage.

Further, the present invention is not limited to these embodiments, but variations and modifications may be made without departing from the scope of the present invention.

What is claimed is:

1. A pattern data correction apparatus comprising:

correction target edge extracting means for extracting a correction target edge to be corrected from circuit patterns;

density calculation region setting means for setting density calculation regions around a given center point on said correction target edge;

area density calculating means for calculating an area density of patterns within said density calculation regions;

correction pattern size calculating means for calculating a size of a correction pattern to be generated on said correction target edge on the basis of the calculated area density; and correction pattern generating means for generating the correction pattern in accordance with the size calculated by said correction pattern size calculating means.

2. The pattern data correction apparatus as defined in claim 1, further comprising graphic calculating means for acquiring corrected pattern data by performing graphic calculations on said circuit patterns and on said correction pattern.

3. The pattern data correction apparatus as defined in claim 1, wherein:

said density calculation region setting means includes multiple region setting means for setting up a plurality of regular polygons which share the same center point and which have different sizes as said density calculation regions;

said area density calculating means includes multiple density calculating means for calculating the area density of each of said regular polygons; and said correction pattern size calculating means includes:

multiplying means for obtaining by multiplication, for each of said regular polygons, a product of a weighting factor established relative to the size of the applicable regular polygon and the area density of the applicable regular polygon;

correction factor calculating means for obtaining a correction factor by adding up the products for all regular polygons involved; and size calculating means for calculating a size of said correction pattern on the basis of said correction factor.

4. The pattern data correction apparatus as defined in claim 1, wherein said correction pattern is a rectangular pattern which has a horizontal edge in parallel with said correction target edge and which has a vertical edge perpendicular to said correction target edge;

wherein said horizontal edge and said vertical edge are separately established; and wherein the center of said correction pattern coincides with the center of said correction target edge.

5. The pattern data correction apparatus as defined in claim 1, wherein said correction target edge extracting means further extracts an edge of said correction pattern as another correction target edge.

6. A method for manufacturing a semiconductor device comprising the steps for:

extracting a correction target edge to be corrected from circuit patterns;

setting density calculation regions around a given center point on said correction target edge;

calculating an area density of patterns within said density calculation regions;

calculating a size of a correction pattern to be generated on said correction target edge on the basis of the calculated area density; and generating the correction pattern in accordance with the size calculated by said correction pattern size calculating step.

7. The method for manufacturing a semiconductor device as defined in claim 6, further comprising a step for acquiring corrected pattern data by performing graphic calculations on the patterns and on said correction pattern.

8. The method for manufacturing a semiconductor device as defined in claim 6, wherein:

said density calculation region setting step includes the step for setting up a plurality of regular polygons which share the same center point and which have different sizes as said density calculation regions;

said area density calculating step includes the step for calculating area density of each of said regular polygons; and said correction pattern size calculating step includes the steps for:

obtaining by multiplication, for each of said regular polygons, a product of a weighting factor established relative to the size of the applicable regular polygon and the area density of the applicable regular polygon;

obtaining a correction factor by adding up the products for all regular polygons involved; and calculating a size of said correction pattern on the basis of said correction factor.

9. The method for manufacturing a semiconductor device as defined in claim 6, wherein said correction pattern is a rectangular pattern which has a horizontal edge in parallel with said correction target edge and which has a vertical edge perpendicular to said correction target edge;

wherein said horizontal edge and said vertical edge are separately established; and wherein a center of said correction pattern coincides with the center of said correction target edge.

10. The method for manufacturing a semiconductor device as defined in claim 6, wherein said correction target edge extracting step further extracts an edge of said correction pattern as another correction target edge.

11. The method for manufacturing a semiconductor device as defined in claim 6, further comprising the step for determining a semiconductor device layout by use of said generated correction pattern.

12. A program storage medium readable by a computer storing semiconductor device manufacturing programs which cause a computer to:

extract a correction target edge to be corrected from circuit patterns;

set density calculation regions around a given center point on said correction target edge;

calculate an area density of patterns within said density calculation regions;

calculate a size of a correction pattern to be generated on said correction target edge on the basis of the calculated area density; and generate the correction pattern in accordance with the calculated size.

13. The program storage medium readable by a computer storing semiconductor device manufacturing programs as defined in claim 12, wherein said semiconductor device manufacturing programs further cause a computer to acquire corrected pattern data by performing graphic calculations on the patterns and on said correction pattern.

14. The program storage medium readable by a computer storing semiconductor device manufacturing programs as defined in claim 12, wherein said semiconductor device manufacturing programs further cause a computer to:

set up a plurality of regular polygons which share the same center point and which have different sizes as said density calculation regions;

calculate the area density of each of said regular polygons;

obtain by multiplication, for each of said regular polygons, a product of a weighting factor established relative to the size of the applicable regular polygon and the area density of the applicable regular polygon;

obtain a correction factor by adding up the products for all regular polygons involved; and calculate a size of said correction pattern on the basis of said correction factor.

15. The program storage medium readable by a computer storing semiconductor device manufacturing programs as defined in claim 12, wherein said semiconductor device manufacturing programs further cause a computer to:

set said correction pattern in the form of a rectangular pattern which has a horizontal edge in parallel with said correction target edge and which has a vertical edge perpendicular to said correction target edge;

establish said horizontal edge and said vertical edge separately; and make a center of said correction pattern coincide with the center of said correction target edge.

16. The program storage medium readable by a computer storing semiconductor device manufacturing programs as defined in claim 12, wherein said semiconductor device manufacturing programs further cause a computer to further extract an edge of said correction pattern as another correction target edge.

17. The program storage medium readable by a computer storing semiconductor device manufacturing programs as defined in claim 12, wherein said semiconductor device manufacturing programs further cause a computer to design a semiconductor device layout by use of said correction pattern.

* * * * *